United States Patent
Gieskes et al.

(10) Patent No.: US 7,267,382 B2
(45) Date of Patent: Sep. 11, 2007

(54) LOW MAINTENANCE VACUUM GENERATION

(75) Inventors: Koen A. Gieskes, Deposit, NY (US); John D. Danek, Vestal, NY (US)

(73) Assignee: Universal Instruments Corporation, Binghamton, NY (US)

( * ) Notice: Subject to any disclaimer, the term of this patent is extended or adjusted under 35 U.S.C. 154(b) by 21 days.

(21) Appl. No.: 10/982,508

(22) Filed: Nov. 5, 2004

(65) Prior Publication Data

US 2005/0062302 A1    Mar. 24, 2005

Related U.S. Application Data

(63) Continuation-in-part of application No. 10/271,761, filed on Oct. 17, 2002, now Pat. No. 6,820,325.

(51) Int. Cl.
*A47J 45/00* (2006.01)
(52) U.S. Cl. ............... 294/64.2; 29/743; 414/752.1
(58) Field of Classification Search ........... 294/64.2; 901/40; 414/627, 737, 752.1; 29/743
See application file for complete search history.

(56) References Cited

U.S. PATENT DOCUMENTS

| 3,967,849 | A | * | 7/1976 | Cagle .................. 294/64.2 |
|---|---|---|---|---|
| 4,299,604 | A | * | 11/1981 | Brenholt ................. 55/303 |
| 4,549,854 | A | * | 10/1985 | Yamamoto .............. 417/187 |
| 4,750,768 | A | * | 6/1988 | Kumar ................. 294/64.1 |
| 4,950,016 | A | * | 8/1990 | Kumar ................. 294/64.2 |
| 5,076,564 | A |   | 12/1991 | Marass |
| 5,244,242 | A | * | 9/1993 | Goedecke et al. ....... 294/64.2 |
| 5,277,468 | A | * | 1/1994 | Blatt et al. ............ 294/64.2 |
| 5,492,566 | A | * | 2/1996 | Sumnitsch ............. 118/500 |
| 5,601,415 | A | * | 2/1997 | Nagai et al. ........... 417/187 |
| 6,364,387 | B1 | * | 4/2002 | Bolotin et al. ......... 294/64.1 |
| 6,467,824 | B2 | * | 10/2002 | Bolotin et al. ......... 294/64.1 |
| 6,851,936 | B2 | * | 2/2005 | Stingel et al. .......... 417/198 |
| 2005/0218677 | A1 | * | 10/2005 | Ilich ................... 294/64.2 |

\* cited by examiner

*Primary Examiner*—Gene O Crawford
*Assistant Examiner*—Esther O Okezie
(74) *Attorney, Agent, or Firm*—Schmeiser, Olsen & Watts (57) ABSTRACT

The present invention features a system to generate vacuum for picking up and holding a component in a component placement machine wherein the arrangement of the elements comprising the system prevents the flow of foreign matter back through the system. One arrangement locates a venturi between a valve and nozzle, thereby minimizing where vacuum exists within the system.

9 Claims, 8 Drawing Sheets

LOW MAINTENANCE VACUUM GENERATION

CROSS-REFERENCES TO RELATED APPLICATIONS

This application is a Continuation-in-Part of U.S. patent application Ser. No. 10/271,761, filed on Oct. 17, 2002, now U.S. Pat. No. 6,820,325 and thus claims priority and benefit thereof.

BACKGROUND OF THE INVENTION

1. Technical Field

This invention relates to the creation of vacuum for one or more pick and place mechanisms mounted in a pick and place machine.

2. Related Art

For the generation of vacuum, it is standard to use compressed air and a venturi. The compressed air blown into the venturi with high speed generates vacuum that can then be connected to the pick and place mechanisms, such as nozzles or vacuum activated grippers, via a manifold, hoses, couplings, and often a valve to connect/disconnect the vacuum from each pick and place mechanism. This way multiple pick and place mechanisms can be connected to single vacuum generator.

One disadvantage of the existing design is that any foreign matter such dirt, dust and other pollution, that is drawn into the pick and place mechanism by the vacuum will pass through the valves, through the hoses and through the couplings and the manifold, before it can be blown out of the system at the venturi. This leads to sticky valves and polluted hoses and manifold. A second disadvantage for the existing design is that because the valves are operating under vacuum conditions, lubricants tend to evaporate more quickly, which leads to failure of the valve(s). Another disadvantage of the current design is that often the vacuum generator is on a stationary part of the machine while the pick and place mechanism itself has to be able to rotate, sometimes over multiple axes. This is achieved using couplings with seals. However any leak of these seals will both diminish the ultimate vacuum force applied to the component part at the pick and place mechanism and also will allow more foreign matter to be drawn into the mechanism at any failed seal location. Still another disadvantage of the current design is that the air rushes through the venturi continuously, whether the mechanism is operating to pick a component or not. With machines often waiting for boards or parts to be replenished, this is wasteful and often noisy.

A need exists for a vacuum generation system that overcomes at least one of the aforementioned, and other, deficiencies in the art.

SUMMARY OF THE INVENTION

The present invention attempts to address the above described issues with vacuum generation in a pick and place machine by positioning a valve and a venturi in close proximity to the pick and place mechanism such that the pick and place mechanism is connected to the vacuum side of the venturi. Therefore when the valve is opened, compressed air is blown into the venturi creating a vacuum at the pick and place mechanism.

A first general aspect of the present invention provides a system for generating vacuum for picking up and holding a component in a component placement machine, the system comprising:

an input of compressed air supplied to a valve;
a pick and place mechanism for picking and holding said component; and
a venturi, for converting said compressed air into a vacuum, wherein said venturi is between said valve and said pick and place mechanism.

A second general aspect of the present invention provides a system for use in a component placement machine, the system comprising:

a plurality of flow passage components, said plurality selected from a group consisting of a hose, a coupling, a valve, and combinations thereof;
a venturi having an exhaust port; and
a pick and place mechanism;
further wherein a first portion of said system has a positive pressure of compressed air flow therethrough and a second portion of said system has negative pressure of compressed air flow therethrough, wherein said first portion includes said plurality of components and said second portion includes said pick and place mechanism.

A third general aspect of the present invention provides a method for generating vacuum for picking up and holding a component in a component placement machine, the steps comprising:

providing compressed air to a valve; and
providing a venturi between said valve and a pick and place mechanism.

BRIEF DESCRIPTION OF THE DRAWINGS

A complete understanding of the present invention may be obtained by reference to the accompanying drawings, when considered in conjunction with the subsequent detailed description, in which.

DETAILED DESCRIPTION OF THE INVENTION

Although certain embodiment of the present invention will be shown and described in detail, it should be understood that various changes and modification may be made without departing from the scope of the appended claims. The scope of the present invention will in no way be limited to the number of constituting components, the materials thereof, the shapes thereof, the relative arrangement thereof, etc. and are disclosed simply as an example of an embodiment. The features and advantages of the present invention are illustrated in detail in the accompanying drawings, wherein like reference numerals refer to like elements throughout the drawings.

The present invention mitigates and/or eliminates at least one of the above mentioned disadvantages. For example, any foreign matter that is entering the pick and place mechanism through the nozzle is immediately discarded at the venturi and does not pass through the valves, couplings, hoses, and/or manifold. Another example, the valves operate in compressed air that is often filtered and sometimes even lubricated for optimum performance of the valves. Since full pressure (e.g., ~70 PSI) is used down to the valves, the size of manifold, hoses and valves can be reduced without impact to the vacuum activation time. Any malfunction of seals in couplings will leak some air out, however this will not harm the vacuum force since the compressed air is of a higher pressure and volume that a leaky seal does not impart a significant air pressure drop at the venturi, nor the pick and place mechanism beyond. The increased pressure of the air will also prevent foreign matter from getting into the mechanism at the leaking seal of a coupling. The mechanism will only use compressed air when it is actually holding a part to the nozzle or gripping a part. When the mechanism is not operating no compressed air is used to maintain a central vacuum. Thus, the vacuum is only created intermittently, as needed.

The embodiments of the present invention pertain to the holding of a component in a component placement machine having one or more pick and place mechanisms which are used for assembling printed circuit boards. The component placement machine includes a system for generating vacuum to allow the component placement machine to pick up and hold components. The inventive system includes a specific arrangement of an input of compressed air, a venturi, and a valve with respect to the pick and place mechanism. This arrangement prevents the flow of foreign matter back through the inventive system.

Figure 1:
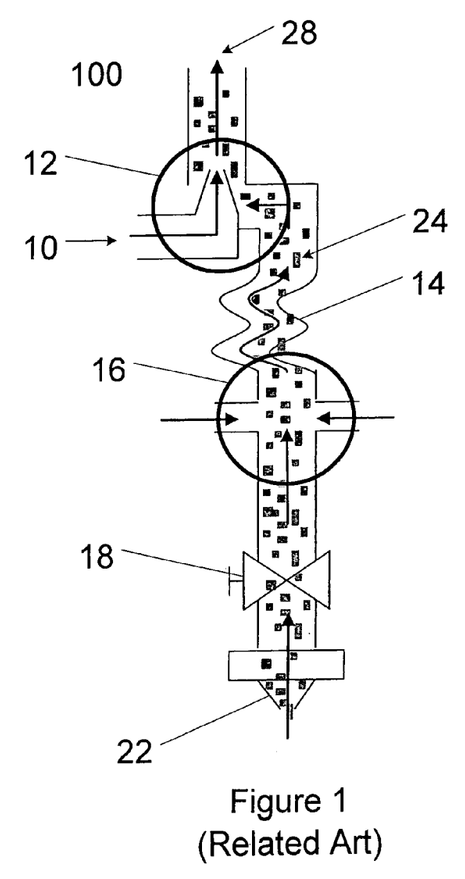
FIG. 1 depicts a schematic view of the generation of vacuum for a single nozzle, of the related art.
Figure 3:
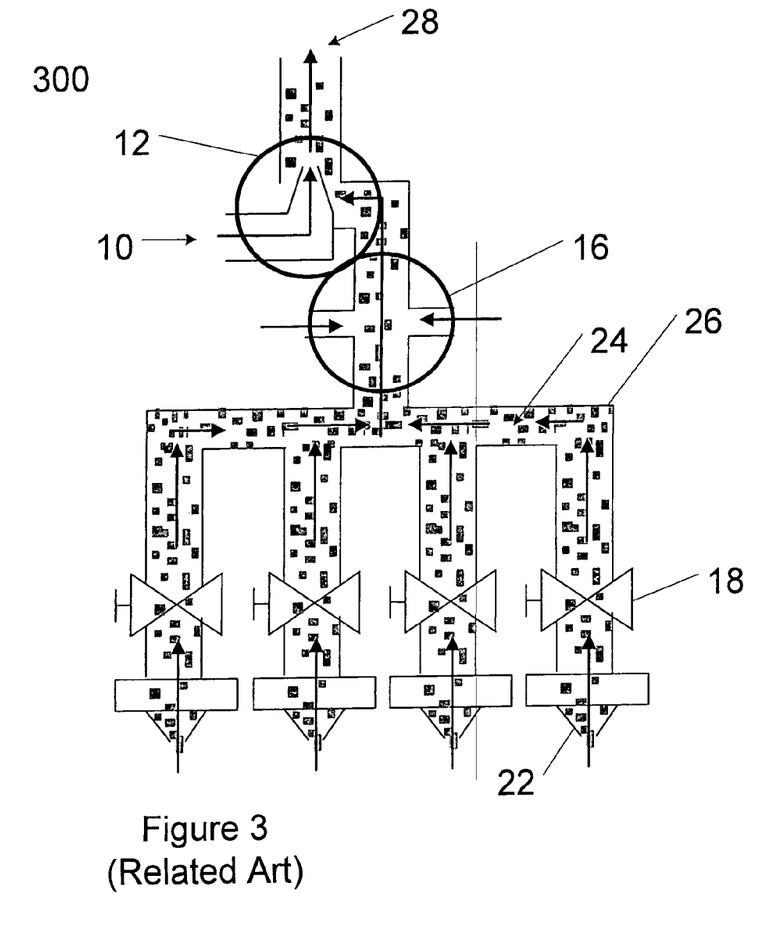
FIG. 3 depicts a schematic view of the generation of vacuum for multiple nozzles, of the related art.

Turning first to FIGS. 1 and 3, which depicts a system 100 and a system 300 in the related art which generates vacuum that enables the picking up and holding of components with a nozzle 22. The system 100 consists of an input of compressed air 10, a venturi 12, hose 14, coupling 16, valve 18, and nozzle 22. The compressed air 10 flows through venturi 12 which in turn causes a vacuum (i.e., negative pressure) to be generated and then distributed through hose 14, coupling 16, and finally down to valve 18. When valve 18 is turned on, vacuum is then provided at nozzle 22 allowing components to be picked and held by the nozzle 22. System 300 is similar to system 100 but adds a manifold 26 between coupling 16 and valve 18 to accommodate the distribution of the vacuum to additional nozzles 22. In this particular arrangement, foreign matter 24 that is small enough to flow through the end of the nozzle 22, such as dirt, dust, and pollution, may flow back through valve 18, coupling 16, hose 14 to an exhaust port 28. The present invention corrects this deficiency by preventing, or at the least significantly diminishing, the flow of foreign matter 24.

Figure 2:
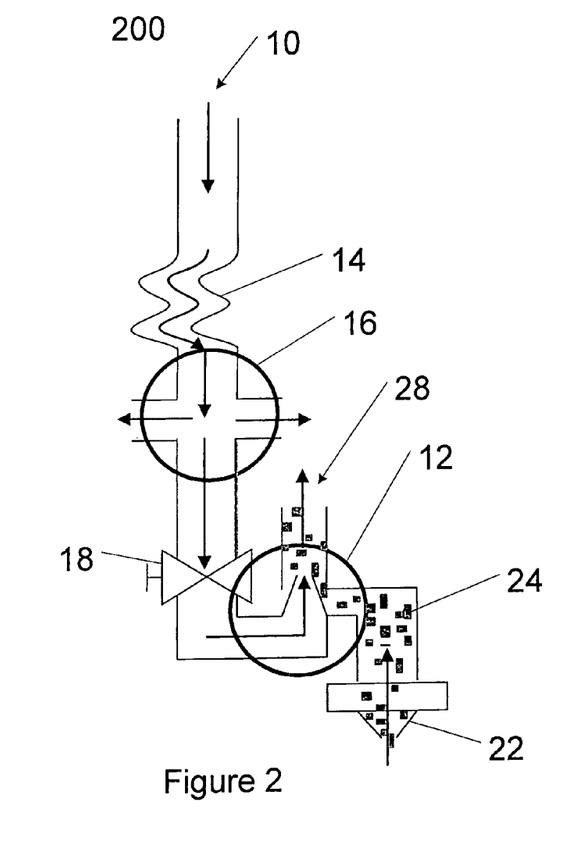
FIG. 2 depicts a schematic view of the generation of vacuum for a single nozzle, in accordance with embodiments of the present invention.
Figure 4:
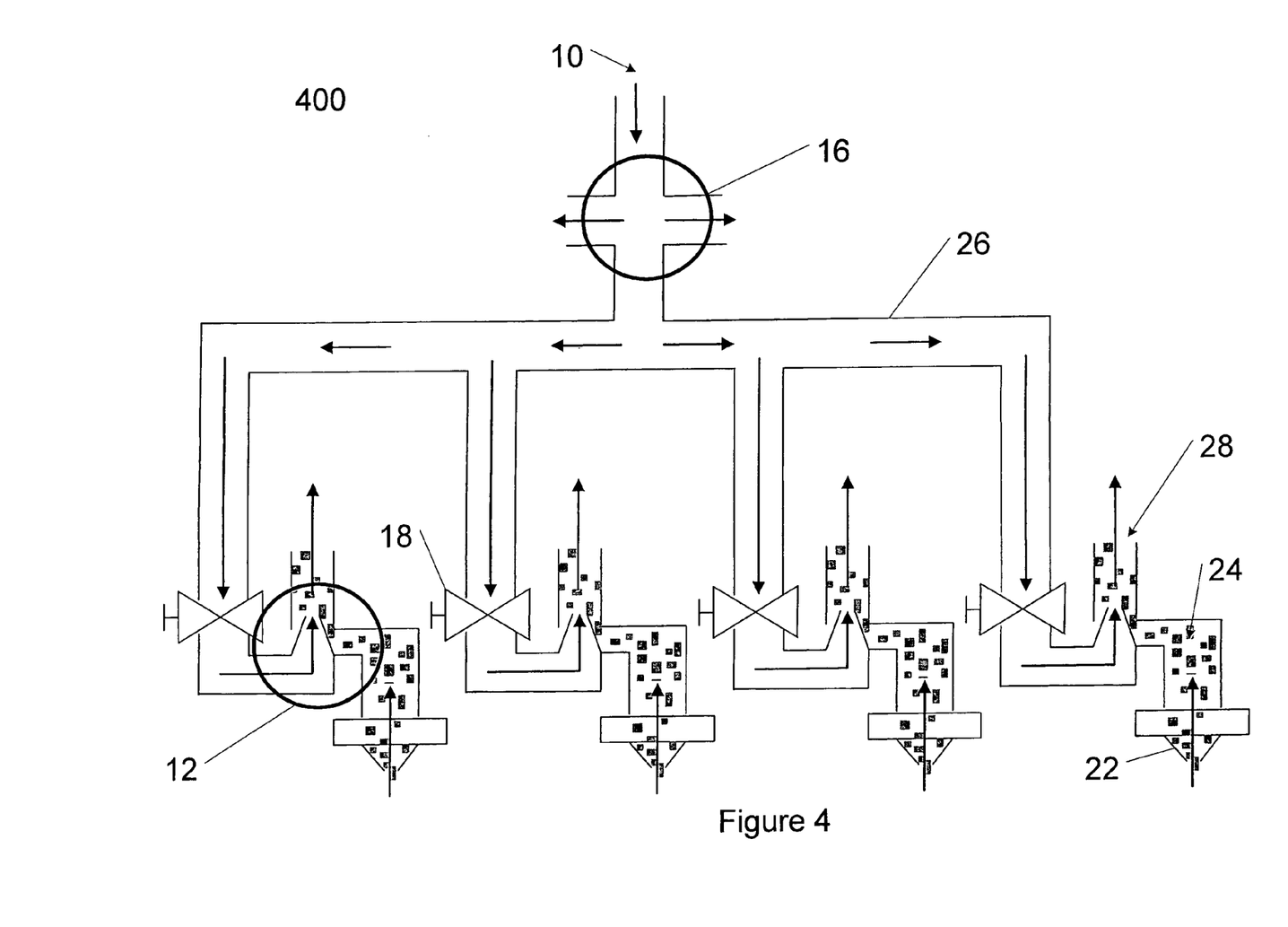
FIG. 4 depicts a schematic view of the generation of vacuum for multiple nozzles, in accordance with embodiments of the present invention.

Referring now to FIGS. 2 and 4, which depicts an embodiment of the present invention for a system 200 and a system 400 for generating vacuum for picking up and holding components with a nozzle 22. System 200 includes the same elements as system 100, but arranged in a different sequence to prevent the back flow of foreign matter 24. In system 200, compressed air 10 flows through various flow passage components, such as hose 14, coupling 16, and down to valve 18. When valve 18 is turned on, the compressed air 12 continues through the nozzle of a venturi 12 which in turn causes a vacuum to be generated, wherein the vacuum is then provided at nozzle 22 and extends through a passageway to an exhaust port 28 of the venturi 12. System 400 is similar to system 200 but adds a manifold 26 between coupling 16 and valve 18 to accommodate the distribution of the compressed air to additional nozzles 22. In this manner, foreign matter 24 exits through an exhaust port 28 of the venturi 12 without passing back through valve(s) 18, coupling 16, or hose 14.

The compressed air 10 supplied to the nozzle of venturi 12 is air under positive pressure. Further, the vacuum generated is air under negative pressure. Thus, the various flow passage components are under a positive pressure, while the pick and place mechanism and passageway leading to the exhaust port of the venturi 12 is under negative pressure.

Although not shown, the same arrangement described above may be used in conjunction with a pick and place mechanism comprising a vacuum actuated gripper. In this case, when valve 18 is turned on, a gripper will be activated such that a component may be held.

Since other modification and changes varied to fit particular operating requirements and environments will be apparent to those skilled in the art, the invention is not considered limited to the example chosen for purposes of disclosure, and covers all changes and modification which do not constitute departures from the true spirit and scope of this invention.

Figure 5:
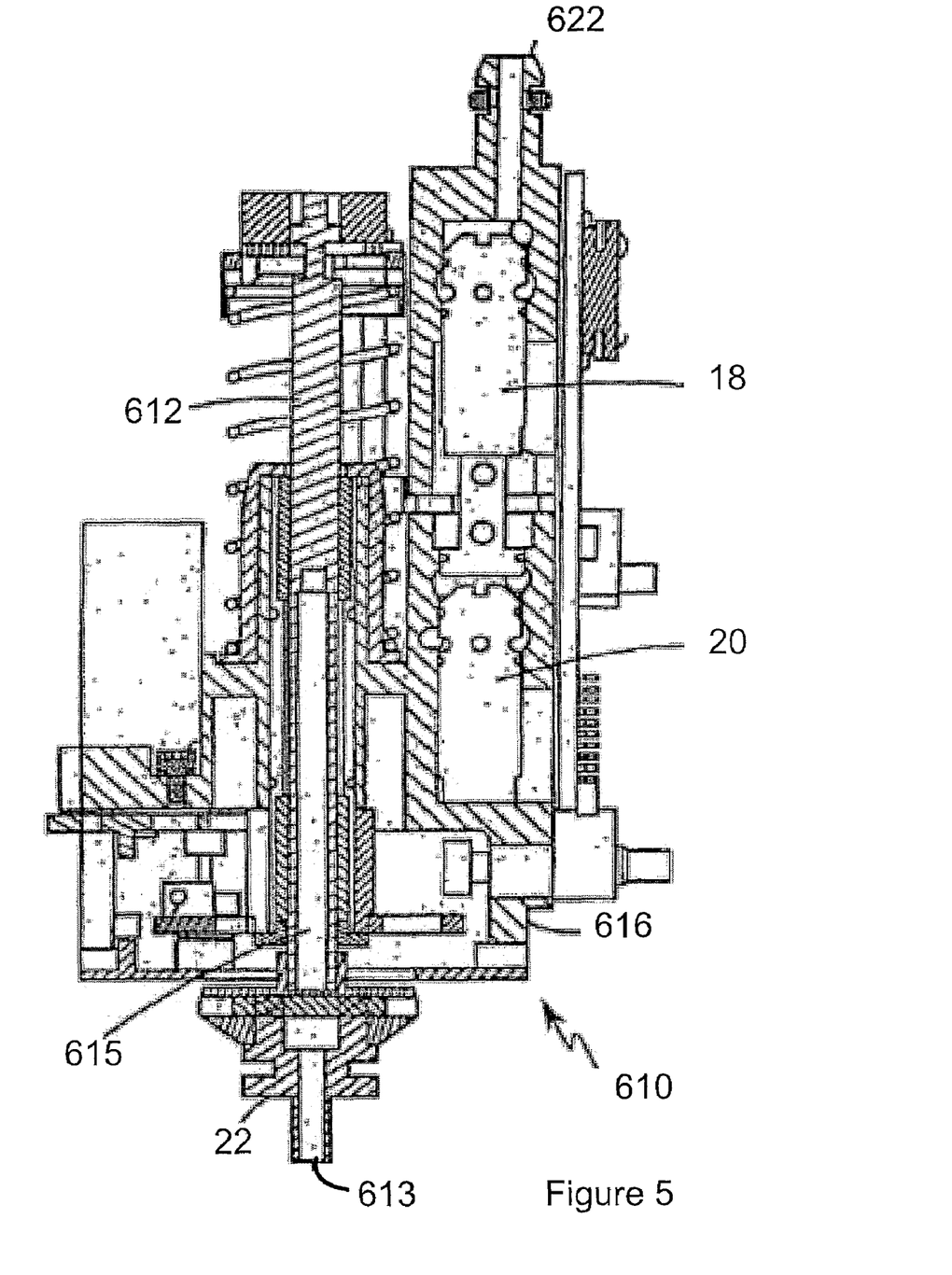
FIG. 5 is a cross-sectional view of a spindle assembly according to a preferred embodiment of the present invention, taken along line I-I of FIG. 2.
Figure 6:
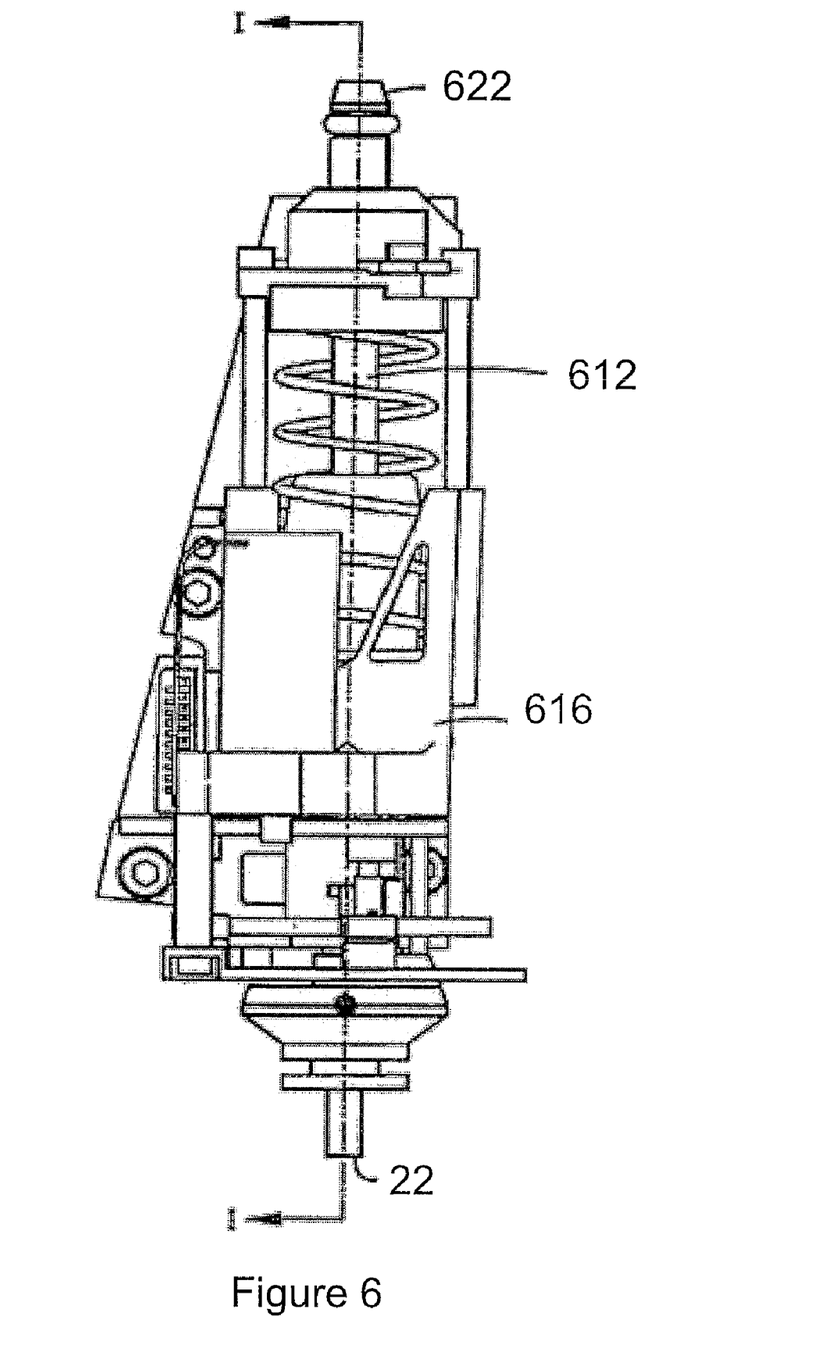
FIG. 6 is a side elevational view of a spindle assembly according to the preferred embodiments of the present invention.

FIG. 5 is a cross sectional view of a preferred exemplary embodiment of a spindle assembly 10 for a pick and place machine in accordance with the present invention. The cross sectional view is taken along line I-I of FIG. 6. The spindle assembly 610 is used in a pick and place head, for picking up electronic components and placing them at their intended locations during an assembly operation.

Turning attention now to FIG. 5, the spindle assembly 610 includes a frame or housing 616 which has a vertical cavity in which the spindle 612 is supported. At a lower end of the spindle 612 is a nozzle 614. The nozzle 614 is the portion of the spindle 612 that makes contact with the dies and components to be picked up by the spindle 612.

As can be seen in FIG. 5, at least a portion of the spindle 612 is hollow, thus creating an air passageway 15 through which a vacuum or air pressure may pass. The air passageway 613 of nozzle 22 connects to air passageway 615 allowing the flow of vacuum or air pressure through nozzle 22. The lower most end of the nozzle 22 is open so that the vacuum or air pressure may be applied to enable the die or component to be picked up and to be detached by the nozzle 22.

Figure 8:
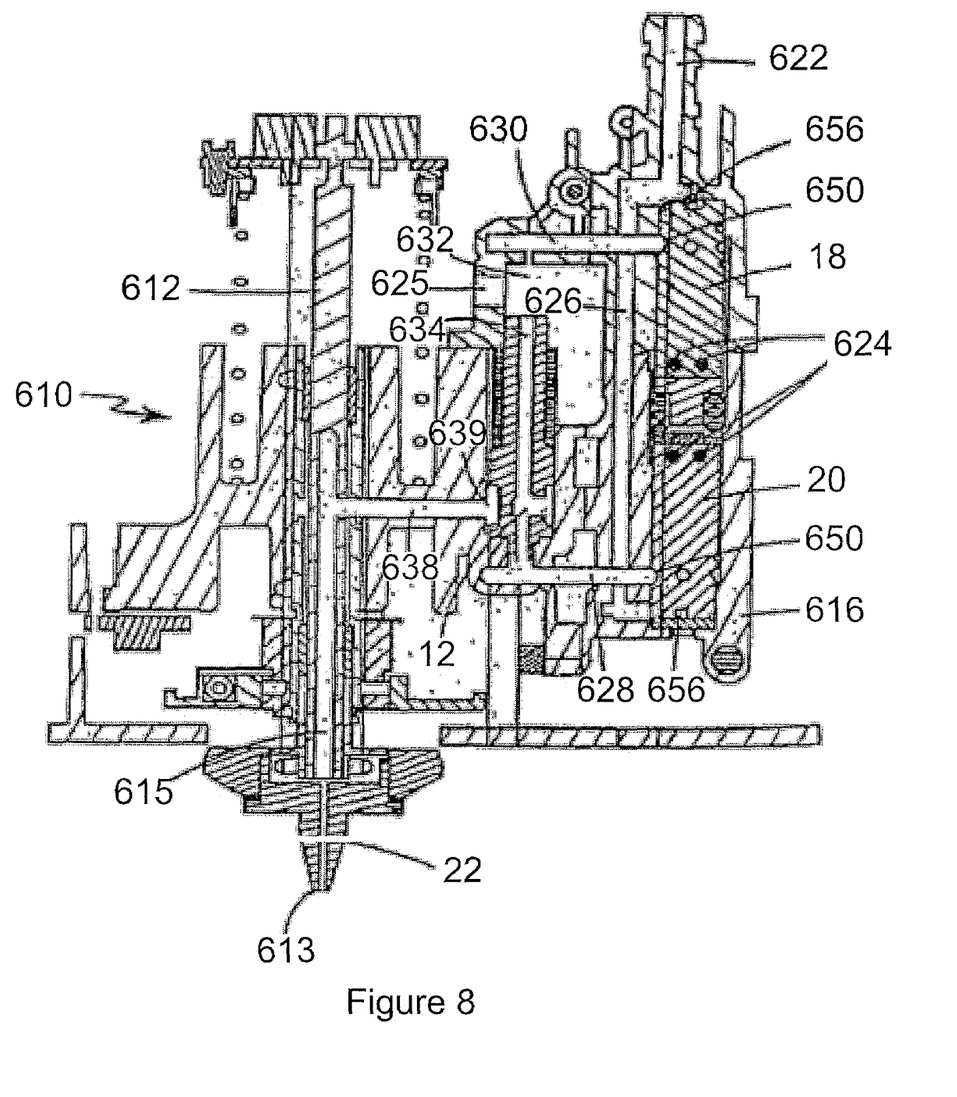
FIG. 8 is a schematic representation of the preferred embodiment of the present invention illustrating the air flow passages.

As can be seen in at least FIGS. 5 and 8, mounted on the housing 616 are two valves 18, 20. Each of the valves 18, 20 is connected to a source of pressurized air via air source passageway 622. Electrical contacts 624 are provided at one end of each valve 18, 20 so that an electric current can be applied to actuate the valve 18, 20. An air outlet port 650 is provided at a side of each of the valve bodies so as to allow compressed air to pass through the valves 18, 20.

According to a preferred embodiment of the present invention, it is possible to actuate the valves with a very short application of current. Specifically, the application of current for approximately 0.5 to 1 milliseconds at about 2.5 to 10 amps is sufficient to actuate the valves in order to open the valves. When the valves are actuated, air can flow from the air inlet port 656 through the valve body and out through the air outlet port 650.

In order to close the valve, a deactivating current is applied to the valve in an opposite polarity as the initial activating current. The deactivating current is less than the activating current. The deactivating current can be applied for about 0.1 to 0.5 milliseconds, preferably 0.12 milliseconds, at about 0.3 amps. Alternatively, the deactivating current can be a sequence of alternating degaussing currents. The preferred voltage for the valves is 12 volts. However, the present invention is not limited to the voltage, amp, and time values set forth above.

The present invention is not limited to the particular details of a valve. One of ordinary skill in the art would contemplate that other types of valves could be used according to the present invention. However, it is preferable that the valve used is of a small size and of a high speed.

Figure 7A:
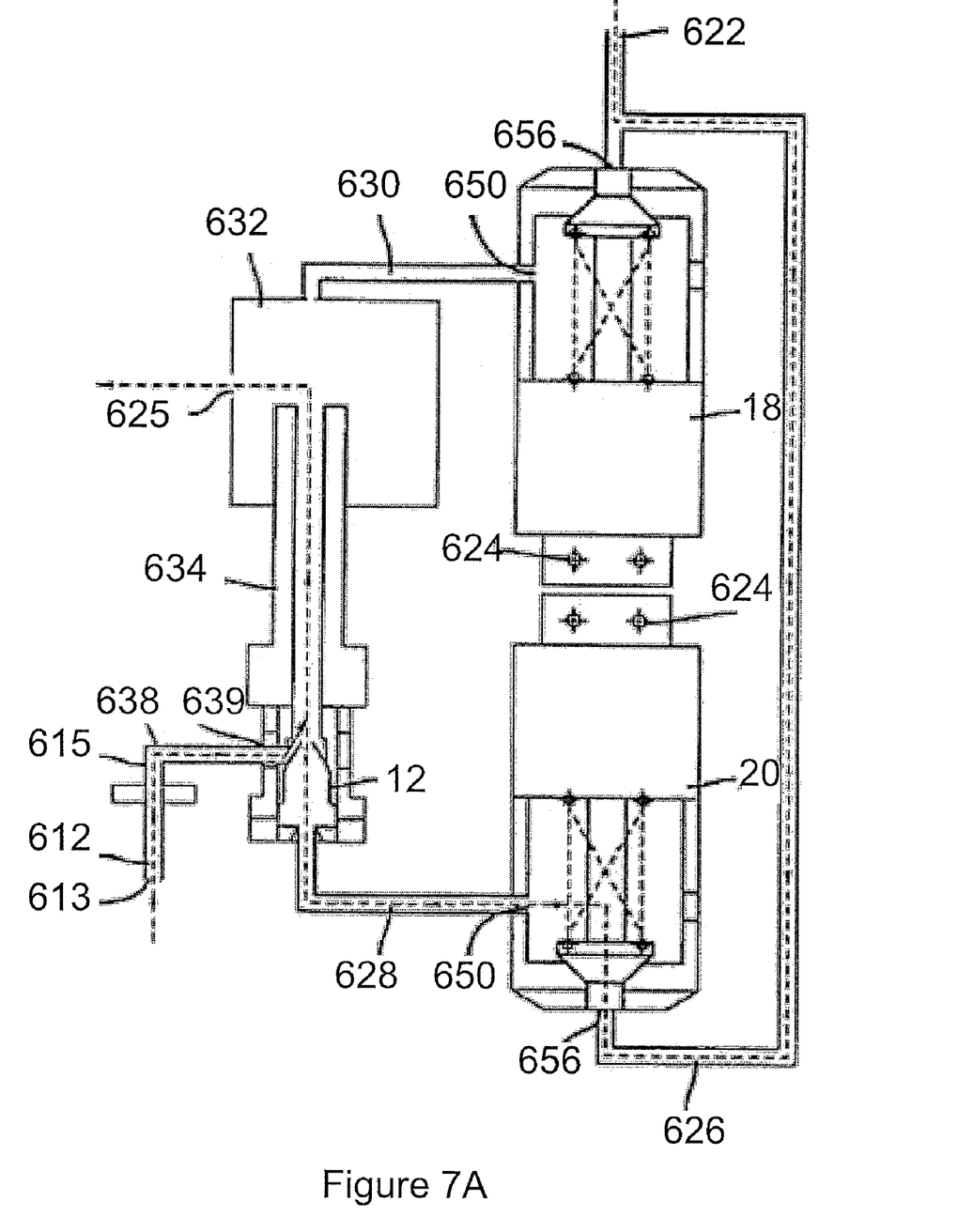
FIG. 7A is a schematic view of a spindle assembly, while a vacuum is applied, according to the preferred embodiments of the present invention.
Figure 7B:
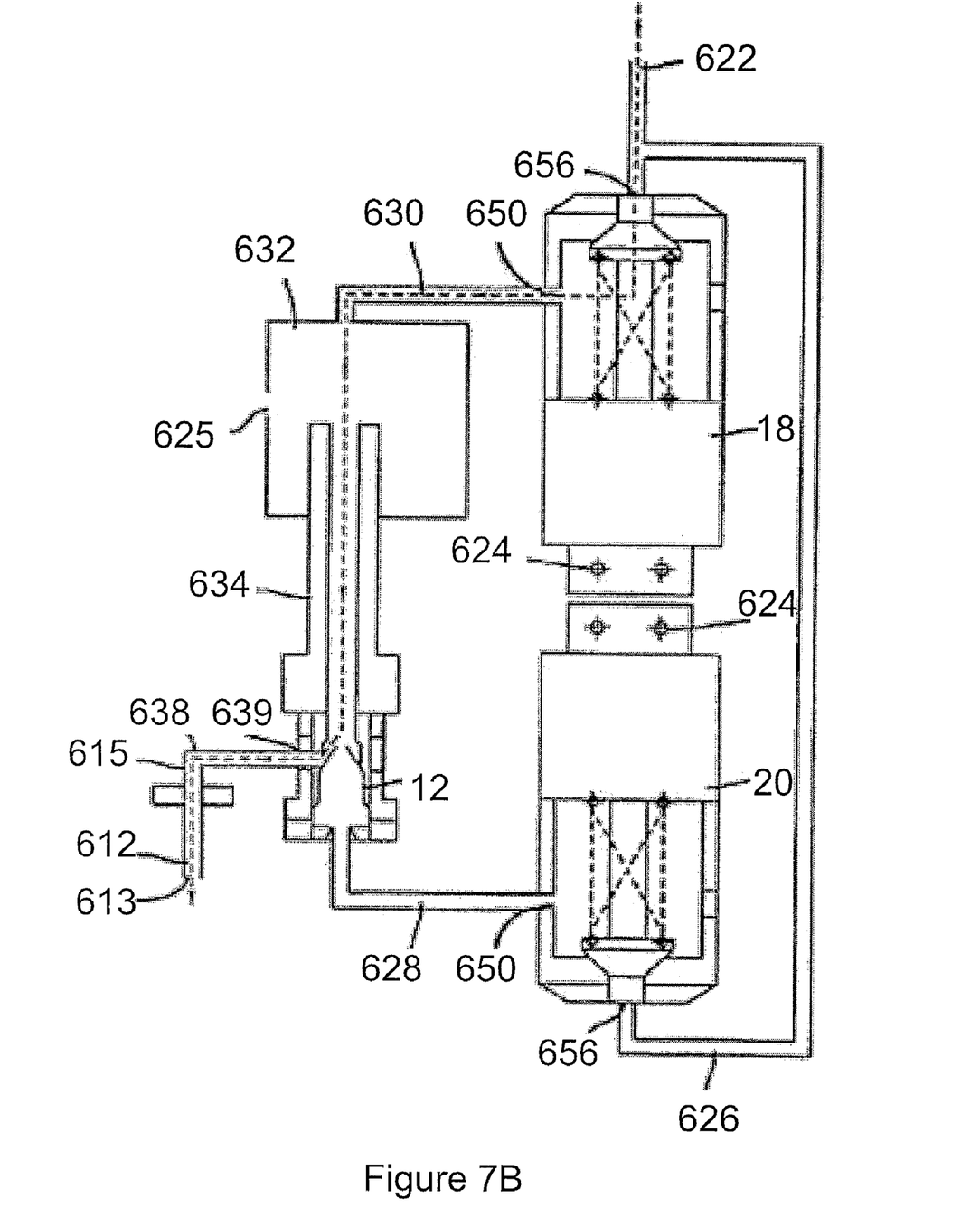
FIG. 7B is a schematic view of a spindle assembly, while an airkiss is applied, according to the preferred embodiments of the present invention.

Turning attention now to FIGS. 7A, 7B, and 8, an air flow circuit of an embodiment of the present invention is illustrated. The various components of the preferred embodiment of the present invention are illustrated in schematic form, and are not necessarily drawn to scale. An air source passageway 622 is connected to a source of pressurized air, and is used to deliver the pressurized air to the two valves 18, 20.

A venturi 36 is also mounted in the housing 616 of the spindle assembly 610. An air passageway 628 connects the air outlet port 650 of valve 20 with a first end of the venturi 12. The venturi 12 is constructed such that when an air pressure is delivered to the first end thereof, a vacuum is created at the opening 639 of the venturi 12. Another air passageway 638 connects the opening 639 of the venturi 12 to the spindle 612. Accordingly, when valve 20 is actuated so as to open the valve, pressurized air from air source passageway 622 passes through an air passageway 626 into the valve 620 and through the air passageway 628 into the venturi 12. A vacuum created by the venturi 12 is then applied to the spindle 612 through the air passageway 638.

An air passageway 634 extends from a second end of the venturi 22, through an expansion chamber 632, and leads to an air system that is used to cool a motor that drives the pick and place head. However, it is not necessary to use the air from the air passageway 634 to cool the motor.

The expansion chamber 632, in its simplest form, enables an expansion of an air pulse moving from the valve 18 to the spindle 612 so as to moderate the pressure thereof. In a preferred embodiment, the expansion chamber 632 includes an enclosed space that is fixed around the second end of the venturi 12. In the preferred embodiment, the expansion chamber includes an opening 625 in a side thereof through which air can escape. As seen in FIGS. 7A and 7B, the air passageway 634 extends through this opening. Another air passageway 630 interconnects the output of valve 18 to the expansion chamber 632. The air passageway 630 is constructed such that it ends at a short distance from the second end of the venturi 12. This short distance is instrumental in moderating pulses of air passing from the air passageway 630 to the venturi 12. However, it will be appreciated that alternative arrangements can be used to moderate the air pressure.

When the valve 18 is actuated so as to open the valve, compressed air from the air source passageway 622 passes through the valve 18 and through the air passageway 630 into the expansion chamber 632. Since the second end of the venturi 12 is spaced from the air passageway 630, when the pressurized air from the valve 18 and air passageway 630 enters the expansion chamber 632, the air pressure is moderated before it enters the venturi 12, and a gentle pulse of air passes through the venturi 12 into the air passageway 638 and to the spindle 612. Accordingly, a pulse of air can be delivered to the spindle 612 by activating valve 18. The pulse of air passes through the valve 18, the air passageway 630, the expansion chamber 632, the venturi 12, the air passageway 638 to the spindle 612. The arrangement of the expansion chamber 632, including the volume, position, distance, and exhaust opening 625, is selected in such a way as to moderate the pulse of air emitted from the valve 18. Accordingly, the expansion chamber 632 moderates the pulse of air and prevents an unnecessarily abrupt pulse of air from being applied to the spindle 612.

In a preferred embodiment, the expansion chamber 632 has an internal volume of approximately 450 cubic millimeters.

In an alternative embodiment of the present invention, the second end of the venturi 12 can be connected directly to the air passageway 634, and bypassing the expansion chamber 632. In such an embodiment, an air passage from the expansion chamber 632 would be directly connected to the spindle 612. Accordingly, the pulse of air could be directed through the expansion chamber 632 and directly into the spindle 612, without having to pass through the venturi 12.

Because of the small, lightweight size of the valves 18, 20, the valves can be actuated within about 0.5 to 0.8 milliseconds. However, in alternative embodiments of the present invention, the valves may be actuated within one or two milliseconds, or other suitable times.

In a preferred embodiment of the present invention, each of the valves weighs approximately 4 grams, has a length of approximately 19 millimeters, and a diameter of 9 millimeters. However, the present invention is not limited to such valves, and valves of alternative sizes and weights may be used in accordance with the present invention. The valves of the preferred embodiment are manufactured by Sturman Industries of Woodland Park, Colo.

Because of the small size of the valves 18, 20, the valves 18, 20 may be located in the housing 616 for the spindle assembly 610, thus enabling the valve 18, 20 to be arranged very close to the spindle 612. In another preferred embodiment of the present invention, the valves 18, 20 are approximately 2 inches from the spindle 612. However, in alternative embodiments, the valves may be 5, 4, or 3 inches, or less, from the spindle 612. Because the distance between the valves 18, 20 and the spindles 612 is small, there is a relatively small volume of air in the connecting passageways that needs to be evacuated during each activation. In one embodiment, the total volume in the passageways to be evacuated is about 500 cubic millimeters. Accordingly, actuation time is decreased by placing the valves 18, 20 close to the spindles 612. The small size of the valves 18, 20, the fast changeover time, and the close proximity of the valves 18, 20 to the spindle 612 all account for very fast turnover speed.

In a further aspect of the present invention, as can be seen in the preferred exemplary embodiment illustrated in FIG. 8, the passageways can be formed directly in the frame or housing 616. Specifically, instead of providing tubing to channel the air flows throughout the system, the preferred exemplary embodiment includes passageways that are drilled, bored, molded or otherwise formed in the housing itself in order to direct the air flows throughout the system.

In one embodiment, the housing 616 is molded from polyetherimide. For example, plastic sold under the tradename ULTEM™ by GE Plastics may be used. In such an embodiment, some or all of the passageways, such as passageways 622, 626, 628, 630, 634, and 638, are either molded directly into the housing 616 or are drilled into the housing 616 after the housing is molded. Preferably, some of the passageways will be molded directly in the housing 616 and others will be drilled.

Alternatively, the housing 616 can be machined from a block of plastic. Or, the housing 616 can be molded, and after the molding process, further details of the housing can be machined.

In the preferred disclosed embodiments, two valves are utilized. However, an embodiment could be used with only one valve, or more than two valves. The one valve would control only the vacuum pressure applied to the spindle. In such an embodiment, no air pulse would be available to dislodge the component from the spindle tip during placement. Such an embodiment is more useful for apparatus intended to move larger components that could easily dislodge from the spindle by gravity alone.

What is claimed is:

1. A system for generating vacuum for picking up and holding an electrical component sized for assembly on a printed circuit board by a component placement machine, the system comprising:
    an input of compressed air supplied to a valve;
    a pick and place mechanism for picking and holding said electrical component; and
    a venturi, for converting said compressed air into a vacuum, wherein said venturi is located between said valve and said pick and place mechanism, such that foreign matter that enters said pick and place mechanism does not pass through any of said valve or a manifold before being discarded by the system.

2. The system of claim 1, wherein when said compressed air flows through said venturi, a vacuum is created at said pick and place mechanism.

3. The system of claim 1, further wherein said system prevents the flow of foreign matter back through said valve.

4. The system of claim 1, wherein the pick and place mechanism is a nozzle.

5. The system of claim 1, wherein the pick and place mechanism is a gripper.

6. A system for use in a component placement machine, the system comprising:
    a plurality of flow passage components, said plurality selected from a group consisting of
    a hose, a coupling, a valve, and combinations thereof;
    a venturi having a nozzle and an exhaust port;
    an electrical component pick and place mechanism configured to facilitate assembly of electrical components on a printed circuit board; and
    a passageway between said venturi and said electrical component pick and place mechanism;
    wherein a first portion of said system has a positive pressure of compressed air flow therethrough and a second portion of said system has a negative pressure of compressed air flow therethrough, wherein said first portion includes said plurality of components and said venturi nozzle and said second portion includes only said electrical component pick and place mechanism, said venturi exhaust port and said passageway therebetween;
    further wherein air flows through and is discarded from said second portion without passing through said first portion.

7. A method for generating vacuum for picking up and holding an electrical component sized for assembly on a printed circuit board by a component placement machine, the steps comprising:
    providing compressed air to a valve; and
    providing a venturi, between said valve and a pick and place mechanism, wherein foreign matter that enters the pick and place mechanism does not pass through any of said valve or a manifold before being discarded by the component placement machine.

8. The method of claim 7, further comprising opening said valve and flowing said compressed air through said venturi such that a vacuum is provided at said pick and place mechanism.

9. The method of claim 7 further comprising preventing the flow of foreign matter back through said valve.

* * * * *

UNITED STATES PATENT AND TRADEMARK OFFICE
CERTIFICATE OF CORRECTION

| | | |
|---|---|---|
| PATENT NO. | : 7,267,382 B2 | |
| APPLICATION NO. | : 10/982508 | |
| DATED | : September 11, 2007 | |
| INVENTOR(S) | : Gieskes et al. | |

It is certified that error appears in the above-identified patent and that said Letters Patent is hereby corrected as shown below:

Column 4
Delete lines 27-33 and insert these lines after Column 7, line 20, as a new paragraph.
Line 35, delete "10" and insert -- 610--
Line 44, delete "614" in two places and insert -- 22 --
Line 48, delete "15" and insert -- 615 --

Column 5
Line 28, delete "36" and insert -- 12 --
Line 38, delete "620" and insert -- 20 --
Line 42, delete "22" and insert -- 12 --

Column 7
Delete lines 26-28 and insert -- a housing containing a spindle for movement therein
  along a longitudinal axis of the spindle;
  the housing accommodating at least one valve, spaced from the spindle, for
    controlling the flow of compressed air supplied to an inner bore of the spindle.
  the inner bore of the spindle having an opening at one end for communicating the
    flow of air to a pick and place mechanism for assisting of said picking and placing
      said electrical component;
  the flow of air between the at least one valve and the inner bore of the spindle is
    through passageways; and --
Line 31, before the word valve, insert -- at least one --
Line 39, after the word said insert -- at least one --

Column 8
Line 5, insert between coupling, and valve -- at least one --
Insert after line 5 --a housing containing a spindle for movement therein along a
  longitudinal axis of the spindle;
  the housing accommodating the at least one valve spaced from the spindle, for
    controlling the flow of compressed air supplied to an inner bore of the spindle;
  the inner bore of the spindle having an opening at one end for communicating the
    flow of air to a pick and place mechanism for assisting of picking and placing an
      electrical component;
  the flow of air between the at least one valve and the inner bore of the spindle is
    through passageways; --
Line 6, insert -- and -- at the end the line
Delete lines 7-11

UNITED STATES PATENT AND TRADEMARK OFFICE
CERTIFICATE OF CORRECTION

PATENT NO. : 7,267,382 B2
APPLICATION NO. : 10/982508
DATED : September 11, 2007
INVENTOR(S) : Gieskes et al.

It is certified that error appears in the above-identified patent and that said Letters Patent is hereby corrected as shown below:

Column 8 (cont'd)
Line 29, delete this line and insert -- providing a housing containing a spindle for movement therein along a longitudinal axis of the spindle;
accommodating at least one valve within the housing, spacing the at least one valve from the spindle, for controlling the flow of compressed air supplied to an inner bore of the spindle;
providing the inner bore of the spindle with an opening at one end for communicating the flow of compressed air to a pick and place mechanism for assisting of said picking and placing said electrical component;
providing passageways for flowing the flow of air between the at least one valve and the inner bore of the spindle is through passageways: and --
Line 30, line 33, line 37 and line 40, after the word said insert -- at least one --

Signed and Sealed this

Eleventh Day of December, 2007

JON W. DUDAS
*Director of the United States Patent and Trademark Office*